(12) United States Patent
Saito et al.

(10) Patent No.: US 6,628,074 B1
(45) Date of Patent: Sep. 30, 2003

(54) PLASMA DISPLAY DEVICE HAVING REINFORCEMENT MEMBER

(75) Inventors: Takashi Saito, Tokyo (JP); Katsuhiko Umeda, Tokyo (JP)

(73) Assignee: Jamco Corporation, Tokyo (JP)

( * ) Notice: Subject to any disclaimer, the term of this patent is extended or adjusted under 35 U.S.C. 154(b) by 317 days.

(21) Appl. No.: 09/670,403

(22) Filed: Sep. 27, 2000

(30) Foreign Application Priority Data

Nov. 1, 1999 (JP) ............................. 11-310608

(51) Int. Cl.[7] ................................ H01J 17/49
(52) U.S. Cl. ....................... 313/582; 313/584
(58) Field of Search ....................... 313/581, 582, 313/584, 495

(56) References Cited

U.S. PATENT DOCUMENTS 5,831,374 A * 11/1998 Morita et al. .............. 313/582

OTHER PUBLICATIONS

Patent Abstracts of Japan; Publication No. 11329253; Publication Date: Nov. 30, 1999; *Abstract*; EPO.

Patent Abstracts of Japan; Publication No. 11041545; Publication Date: Feb. 20, 1999; *Abstract*; EPO.

Patent Abstracts of Japan; Publication No. 10172445; Publication Date: Jun. 26, 1998; *Abstract*; EPO.

Patent Abstracts of Japan; Publication No. 02239548; Publication Date: Sep. 21, 1990; *Abstract*; EPO.

Patent Abstracts of Japan; Publication No. 10058067; Publication Date: Mar. 3, 1998; *Abstract*; EPO.

* cited by examiner

*Primary Examiner*—Vip Patel
(74) *Attorney, Agent, or Firm*—Armstrong, Westerman & Hattori, LLP.

(57) ABSTRACT

In a plasma display device, a reinforcement member 15 constituted of a sandwich panel (laminated panel) formed by sandwiching a honeycomb core 151 made of aluminum alloy with aluminum alloy plates 153 is mounted on the back surface of a display module 10. The reinforcement member 15 is light in weight, satisfies the abuse load requirements, and is equipped with supporting members 17 having cooling fins 171 mounted to the interior of said members 17 and providing heat diffusing function to the supporting members.

4 Claims, 6 Drawing Sheets

PLASMA DISPLAY DEVICE HAVING REINFORCEMENT MEMBER

FIELD OF THE INVENTION

The present invention relates to a plasma display device, and more specifically, to a plasma display device mounted on mobile objects, such as an aircraft or a vehicle.

DESCRIPTION OF THE RELATED ART

Services provided to passengers on an aircraft include the projecting of movie and information on a screen using a video projector. Along with the recent development of the plasma display device, there are attempts to mount the plasma display device on the aircraft instead of the conventional video projector and screen.

When mounting a plasma display device on an aircraft, the display must satisfy various safety requirements. One strict requirement is the load requirement, which considers the case where the human body or objects on the aircraft collide against the glass plate of the display device due to turbulence or steerage during flight or drive.

This load requirement is called the abuse load, which is set assuming the case where a load as large as 136 kg is added to any random position on a 10-cm square glass surface.

The requirement load of a normal plasma display device is relatively small compared to the abuse load, assuming such case as where a ball and the like hit the glass surface.

In order to fulfill the above requirements, the conventional device includes a tempered glass having a thickness of approximately 3 mm mounted on the surface of a glass plate of the display module, with a gap of approximately 3 mm formed between the tempered glass and the display module body. Due to the 3-mm gap, the tempered glass will not contact the display module body even if the load deflects the tempered glass. In other words, until the deflected tempered glass reaches the glass of the display module body, the display module will receive no influence by the abuse load.

The conventional plasma display device is explained with reference to FIG. 8.

FIG. 8 is a cross-sectional view mainly showing the display module portion. A display module 3 comprising upper and lower glass plates constituting luminescent pixels is equipped with electronics 5 mounted on the back surface thereof. The electronics 5 are connected to the module 3 through flex lead 7. A tempered glass 1 is mounted on the front surface of the display module 3 with a gap 2 of approximately 3 mm formed therebetween, thereby protecting the display module 3.

As shown in FIG. 9, according to this type of display modules, even if the tempered glass 1 is deflected by the load, the load will not be added the display module 3 until the tempered glass 1 reaches the glass of the module 3, or in other words, while the deflection is smaller than the 3-mm gap 2.

Moreover, according to a general plasma display device, an aluminum alloy plate 4 having a thickness of approximately 2 mm is adhered on the back surface of the glass plate constituting the module. The aluminum alloy plate 4 is for mounting electronics 5 and power unit for driving the display device 3, and not for supporting the display module from the added load.

One method for reinforcing the device is to provide an aluminum alloy (back surface) plate 4 having a greater thickness, so that it may bear the abuse load of the aircraft. However, if the aluminum alloy plate 4 is formed thick enough to endure the load, the weight of the display is increased greatly. Therefore, such method is not preferable.

Since the conventional plasma display device is designed based on the assumption that the display is to be used under a static environment, such as at home or in the office, it is extremely difficult for the conventional device to satisfy various conditions such as strength, heat diffusion, weight and size required for mounting the display device on an aircraft or a vehicle.

SUMMARY OF THE INVENTION

The present invention aims at solving the problem. The present invention aims at providing a plasma display device capable of being used under a mobile environment, such as in the case where the plasma display device is to be mounted on an aircraft, a train, a bus, or a ship. In other words, the present invention aims at providing a plasma display device that is strong enough to satisfy various requirements such as abuse load, vibration and shock, and equipped with a heat diffusing function for diffusing the heat generated from the module, with only minimum increase in size and weight compared to the conventional display device.

According to the present invention, a reinforcement member constituted by a sandwich panel (laminated panel) formed of a honeycomb core or a corrugated core made of aluminum alloy sandwiched with aluminum alloy plates and mounted on the back surface of the display module. The reinforcement member is light, and it enables the display device to satisfy the abuse load requirements.

Moreover, according to another claim, the laminated panel is provided with a heat diffusing function.

DETAILED DESCRIPTION OF PREFERRED EMBODIMENTS

Embodiment 1

Figure 1:
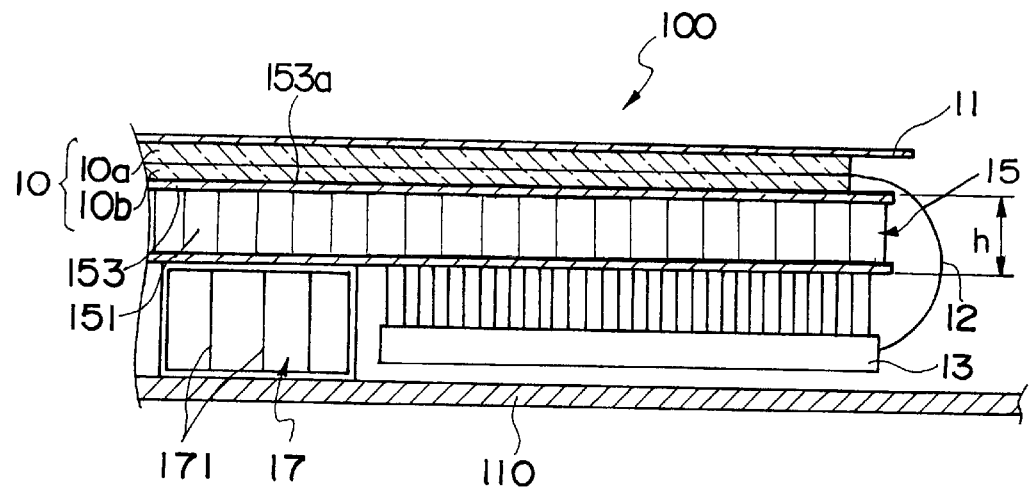
FIG. 1 is a cross-sectional view showing the main portion of the plasma display device according to the present invention.
Figure 2:
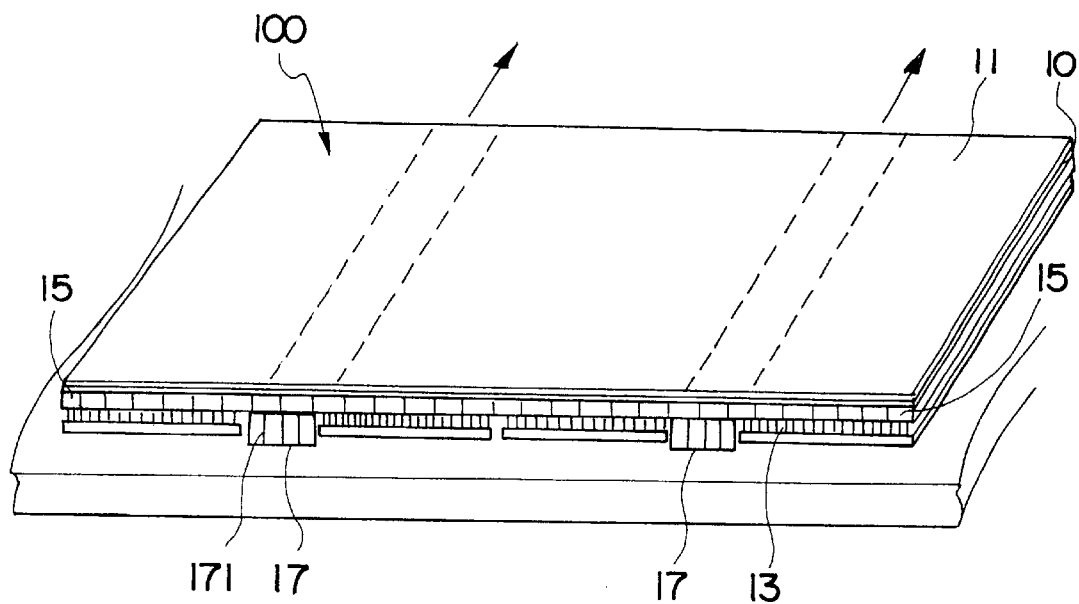
FIG. 2 is a perspective view showing the whole plasma display device according to the present invention.

FIG. 1 is a cross-sectional view mainly showing the module portion of a plasma display device reinforced with a laminated panel according to the present invention. FIG. 2 is a perspective view showing the whole device.

A display module 10 of a plasma display device 100 according to the present invention is equipped with luminescent pixels formed of a first glass plate 10a and a second glass plate 10b.

A cover (sheet) plate 11 formed of synthetic resin (such as PET) is laminated on the surface of the first glass plate 10a.

Electronics 13 are connected on the back surface of the second glass plate 10b via a reinforcement member 15. Each electronic 13 is electrically connected to the display module 10 through a flex lead 12.

The reinforcement member 15 is a laminated panel formed by adhering aluminum alloy plates 153 on both sides of an aluminum honeycomb core 151 (called the aluminum honeycomb panel).

The surface of the plate (aluminum alloy plate) 153 on the display module side of the reinforcement member 15 opposite the display module 10 is formed as a mirror surface 153a.

Mounted on the back surface of the plate on the other side of the reinforcement member 15 from the display module are electronics 13 and support members 17.

The support member 17 is a hollow pillar-shaped member with a closed cross-section, with fins 171 mounted within the hollow portion. The structure of the support member 17 is very solid, and it also serves as a mounting member for mounting the plasma display device 100 onto a member 110 to which the display should be placed (such as the wall of an aircraft or a vehicle).

The support member 17 is mounted on the plasma display device 100 so as to penetrate either the vertical direction or the transverse direction of the plasma display device. The fins 171 are mounted in the longitudinal direction. The plural support members 17 are positioned on plural areas of the device 100 depending on the size of the device 100.

A blower placed outside the device may be connected to the inner hollow space of the support members 17. In such case, the air generated from the blower is sent into the hollow pillar-like space of the support member 17, and forcedly cools the heat generated from the display module 10 and electronics 13.

As explained, the support members 17 serve both as mounting members for fixing the plasma display device 100 to position, and as cooling members.

Figure 3:
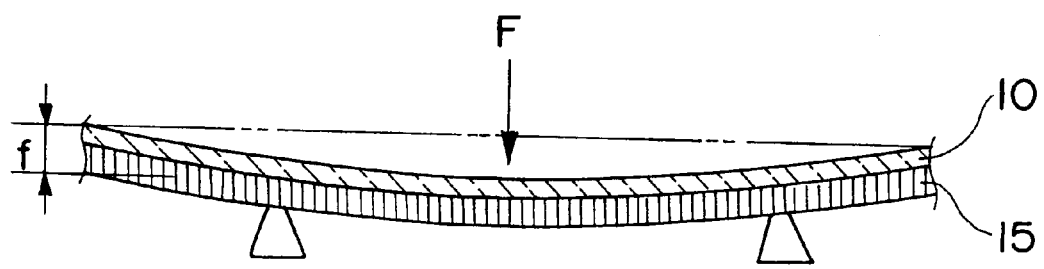
FIG. 3 is an explanatory view showing the loaded state of the display module according to the present invention.

FIG. 3 explains the case where the present display module 10 of the plasma display device 100 receives abuse load and deforms.

When force F is loaded on the upper surface of the display module 10, the display module 10 and the reinforcement member 15 are deflected. The amount of deflection is shown as f.

The relation between the load and the deflection (deformation) of the display module 10 is examined. The result of the experiment is shown in FIG. 4.

Figure 4:
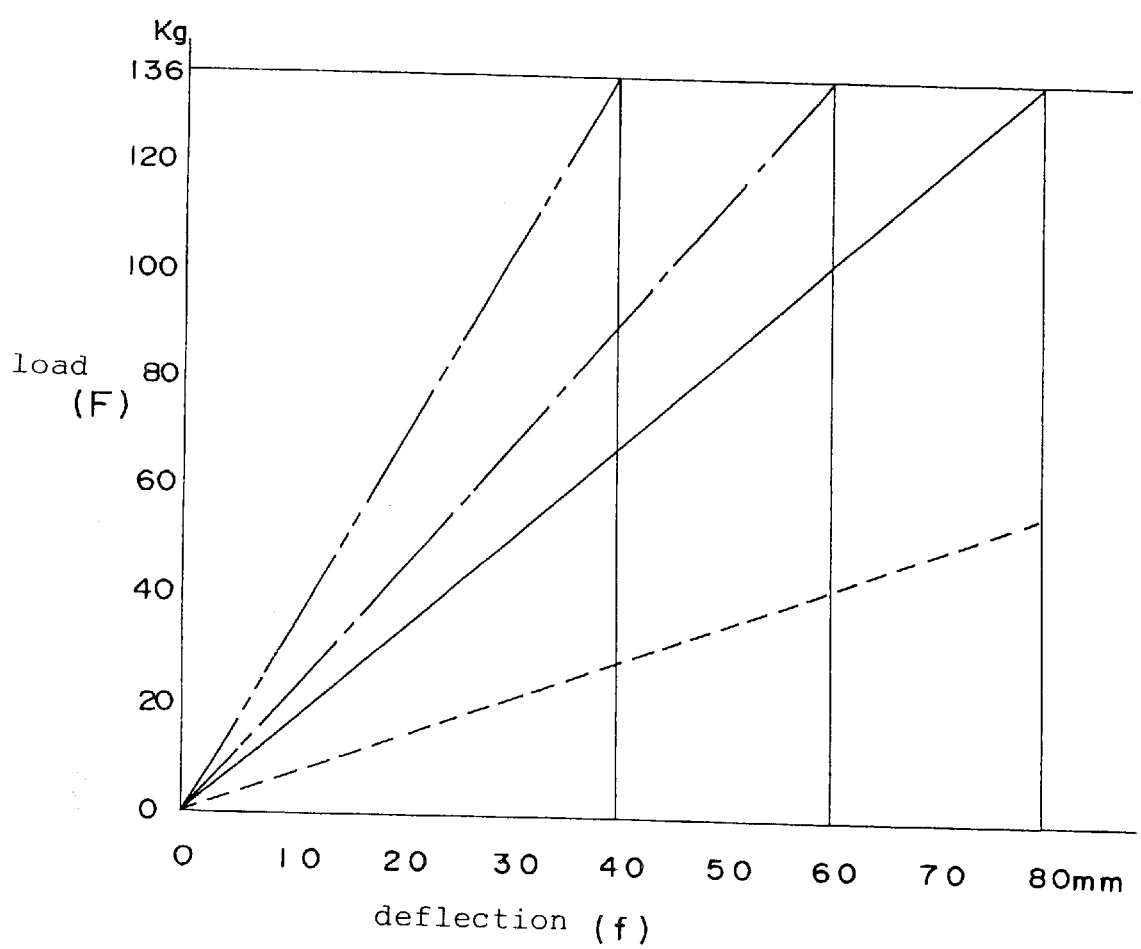
FIG. 4 is a graph showing the relation between the deflection and the load added to the display module with and without a reinforcement member.

The chain line of FIG. 4 shows the deflection of the display module when a required load of 136 kg is loaded to a 10-cm square test piece (specimen).

As shown in the graph, the display module is destructed under a load of 60 kg or less and at a deflection of 8 mm.

When the maximum deflection of the normal display module is assumed to be 8 mm, the amount of deformation (deflection) f of the display module 10 equipped with a reinforcement member 15 depends on the level of flexural rigidity of the laminated panel or reinforcement member 15.

Therefore, under the condition that the maximum amount of deflection of a normal display module is 8 mm, the status of deflection of the reinforcement member 15 is tested, with its thickness varied. The load is set to 136 kg. The result of the experiment is shown in FIG. 4.

The experiment is performed using three kinds of reinforcement members, each having a different thickness.

Reinforcement member 1 (thin reinforcement member): shown by the continuous line.

Reinforcement member 2 (member having intermediate thickness) shown by the chain single-dashed line.

Reinforcement member 3 (thick reinforcement member) shown by the chain double-dashed line.

As learned from the experiment, the thin reinforcement member 1 recorded a maximum amount of deflection 8.0 mm of the display module when the load of 136 kg/mm is added thereto. The reinforcement members 2 and 3 having a thickness greater than the member 1 were each deflected to an amount of 4.0 mm and 6.0 mm, when the load of 136 kg/mm is added to each member respectively.

On the other hand, the stress provided to the glass of the display module 10 is inversely proportional to the curvature of deflection (dend radius), and proportional to the thickness.

Based on the result of the above experiment, the destruction of the display module 10 reinforced by mounting a reinforcement member (laminated panel) 15 thereto may be prevented by providing flexibility to the display module. This is realized by utilizing a thin glass for the display module and a thin reinforcement member 15.

Therefore, the appropriate value of flexural rigidity of the reinforcement member (laminated panel) 15 is determined, which is within the range that the glass of the display module 10 will not break by the deflection or bend. The density of the core (the thickness and the cell size of the core) of the reinforcement member (laminated panel) 15, the adhesion method and so on of the reinforcement member are selected, so as to realize the determined appropriate value of flexural rigidity of the member.

For example, according to the present embodiment, if the reinforcement member 15 has a panel thickness of h=10 mm, the cell size of the aluminum honeycomb core is 8 mm, the thickness of the core foil is 50 micron, and the thickness of the upper and lower aluminum alloy plates (panel surface plates) 153 are each 1.0 mm. The material is an aluminum alloy A5052-H34 (JIS H4000)

The display module 10 according to the present invention is equipped with a reinforcement member 15. The present invention enables to reduce the thickness of the glass plates 10a and 10b, realizes a light-weight display device with a secured amount of deflection, and satisfies the required load resistance.

As disclosed in the present embodiment, in case the display device is to be mounted on an aircraft, a plastic sheet such as a PET and the like is used as the cover plate 11 to provide only a local reinforcement and to reduce the display weight.

Moreover, electromagnetic waves such as light, heat wave and radio wave tend to leak out from the back surface of the display module 10, and causes the temperature of the reinforcement member (laminated panel) 15 to rise more than necessary. Therefore, according to the embodiment, the surface of the laminated panel 15 contacting the display module 10 is formed as a mirror surface 153a. The mirror surface reflects the leaked electromagnetic waves. According to the structure, the heat absorbed by the reinforcement member (laminated panel) 15 may be reduced, and the brightness of the image displayed on the panel is improved.

Similarly, if an adhesive is used to adhere the reinforcement member (laminated panel) 15 to the display module 10, it is important that a minimum amount of adhesive is used, since the adhesive absorbs electromagnetic wave and is thereby heated.

The requirement for strength and the requirement for the level of cooling ability of the display device depend on the aircraft or the vehicle that the display is to be mounted. Therefore, the laminated panel corresponding to such request must be designed based on the experiment data explained above.

The plasma display device 100 according to the present invention satisfies the abuse load endurance of the display module by applying a reinforcement member 15 to the display module, and at the same time, reduces the electromagnetic waves absorbed by the reinforcement member 15 which turn into heat, by forming a mirror surface 153a to the surface of the reinforcement member 15 adjacent the display module 10, and reflecting the electromagnetic waves leaking out from the back surface of the display module.

Moreover, when the reinforcement member 15 of the laminated panel absorbs the heat generated from the display module 10 and the electronics 13, the absorbed heat can be diffused by the cooling fins 171 located within the support members 17 (cooling members) provided to plural areas of the display.

According to the present embodiment, no tempered glass for reinforcing the display is mounted on the front surface of the display module 10. In stead, a PET plastic sheet is mounted on the surface of the display module glass, which provides protection to the surface of the glass and reduces the weight of the display device. According to the present embodiment, there is no need to form a gap between the display module 10 and the PET plastic sheet 11.

According to the present invention, a sandwich panel formed by sandwiching a honeycomb core made of aluminum alloy having high flexural rigidity with aluminum alloy plates (hereinafter called the laminated panel) is mounted on the back surface of the display module, in order to improve the destructive strength of the display device. Moreover, such structure of the display device not only satisfies the requirements related to abuse load endurance of the display, but also prevents the display device from being heated by providing heat diffusing functions to both the laminated panel and the supporting members, utilizing the heat conductivity of the aluminum honeycomb panel.

Embodiment 2

The present embodiment relates to a display device equipped with a reinforcement member having a heat diffusing function, and therefore, satisfies the strict temperature requirement.

Figure 5:
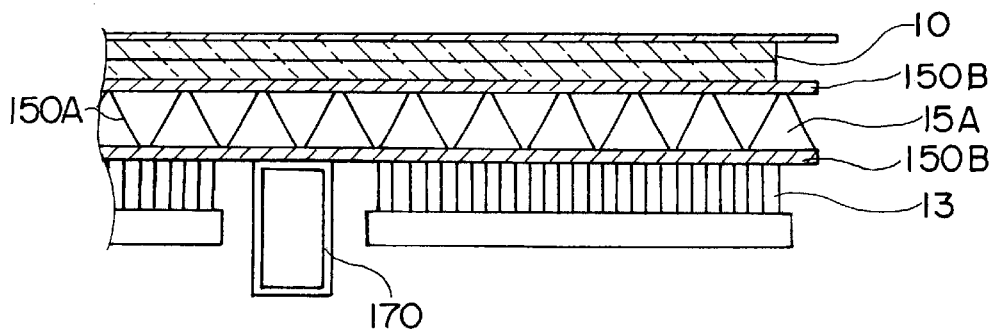
FIG. 5 is a cross-sectional view showing the main portion of the plasma display device according to embodiment 2.
Figure 6:
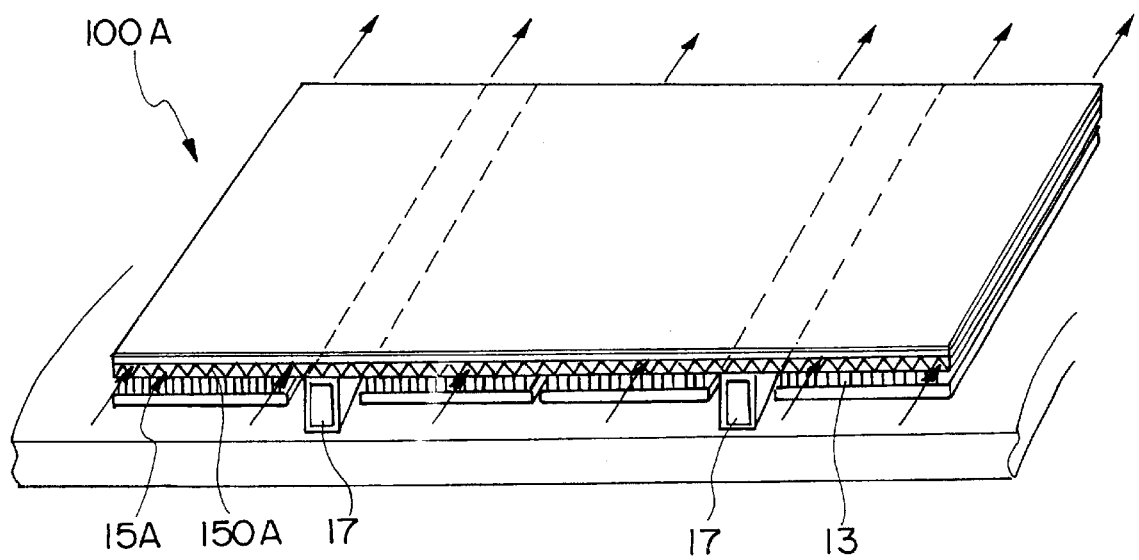
FIG. 6 is a perspective view showing the whole plasma display device according to embodiment 2.

FIG. 5 is a cross-sectional view mainly showing the module portion of a plasma display device equipped with a laminated panel as a reinforcement member, with an aluminum corrugated core having a heat diffusing function. FIG. 6 is a view showing the whole device.

A reinforcement member 15A is formed by sandwiching a truss-shaped corrugated core (cooling fin) 150A with aluminum alloy plates 150B. The plasma display device comprises the reinforcement member 15A, a display module 10 and electronics 13. When the display module 10 of the display device receives bending moment, the reinforcement member 15A receives the shear force, and the corrugated core 150A functions as an air cooling fin.

The truss-shaped cooling fin 150A is soldered (brazed) onto the aluminum surface plates 150B, and provides good heat conductivity.

Moreover, supporting members 170 that each serve both as a cooling member and a mounting member are mounted between electronics 13.

Figure 7:
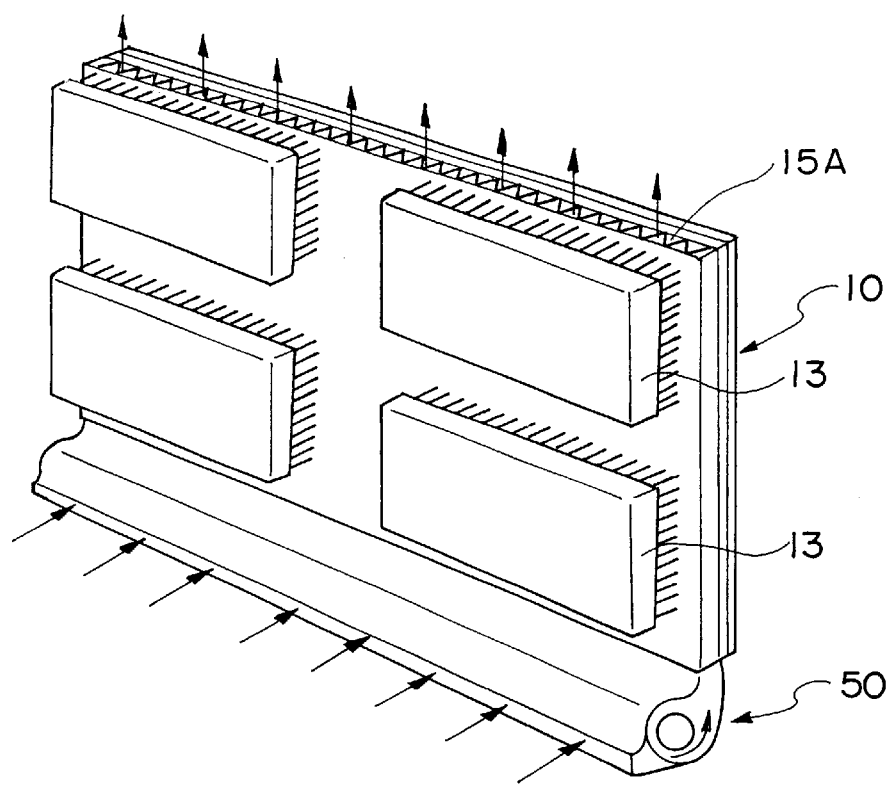
FIG. 7 is a perspective view showing the plasma display device equipped with a blower.
Figure 8:
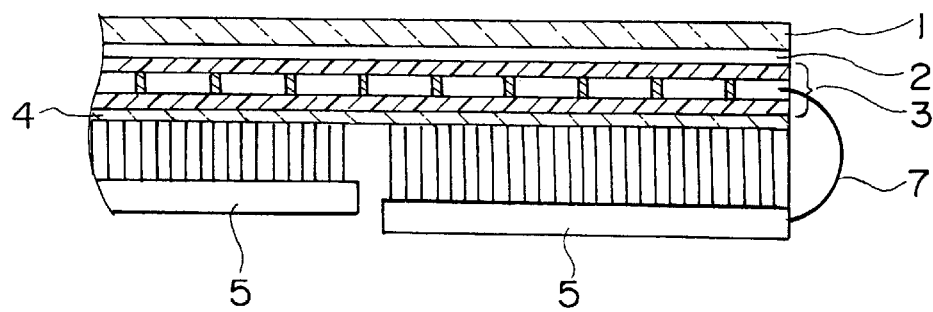
FIG. 8 is a cross-sectional view showing the main portion of the plasma display device according to the prior art.
Figure 9:
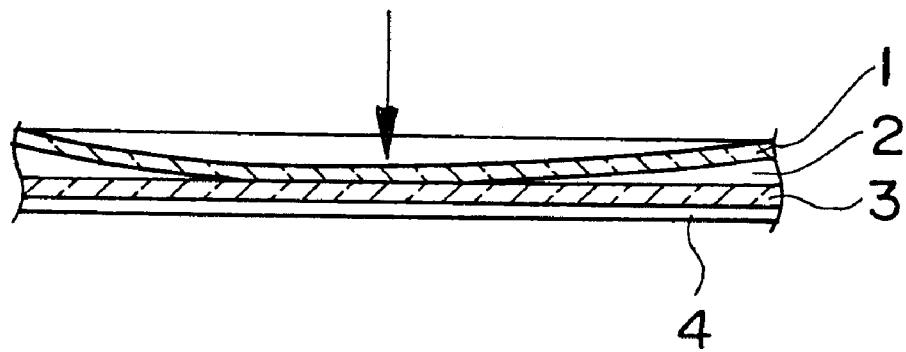
FIG. 9 is an explanatory view showing the loaded state of the display module according to the prior art.

As shown in FIG. 7, a blower 50 is connected to the cooling fin 150A of the reinforcement member 15A providing air to the core for cooling the fin 150A. By cooling the fin 150A, the whole reinforcement member 15A is cooled.

Cooing the reinforcement member 15A not only leads to cooling the display module, but also contributes to cooling the electronics mounted to the back surface of the display.

According to the present embodiment, the thickness of the cooling fin 150A is set for example to 75 microns, and the thickness of each panel surface plate 150B is set to 1.0 mm. The material of these members is aluminum alloy A6061-H32 (JIS H4000).

As explained, by utilizing a reinforcement member (laminated panel) 15A having a corrugated core made of aluminum alloy having high flexural rigidity as a back surface plate, the disruptive strength of the display module 10 is improved. Moreover, by sending air through the corrugated core (laminated panel) 150A, the display module 10 and the electronics 13 connected to the back surface of the display module will be cooled advantageously.

The present invention provides a plasma display device that can be mounted on an aircraft or a bus and the like and used under a dynamic atmosphere, equipped with a display module that satisfies the necessary safety requirements. Moreover, since there is no need to utilize tempered glass for reinforcing the surface of the display module (that was mounted on the surface of a prior art display module) the weight of the display device is advantageously reduced. The plasma display device according to the present invention is also equipped with cooling means.

We claim:

1. A plasma display device comprising a display module equipped with luminescent pixels, electronics mounted on the back surface of said display module via a reinforcement member and supporting members equipped on the surface on which said electronics are mounted; wherein said supporting members each having a closed cross-section and equipped with cooling fins mounted to the interior thereof, and said reinforcement member is constituted by a laminated panel formed of an aluminum honeycomb core and aluminum alloy plates.

2. A plasma display device comprising a display module equipped with luminescent pixels, electronics mounted on the back surface of said display module via a reinforcement member and supporting members equipped on the surface on which said electronics are mounted, wherein said supporting members each having a closed cross-section and equipped with cooling fins mounted to the interior thereof, and said reinforcement member is constituted by a laminated panel formed of a corrugated core and aluminum alloy plates.

3. The plasma display device according to claim 1 or claim 2, wherein the surface of said aluminum alloy plate of said reinforcement member adjacent said display module is formed as a mirror surface.

4. The plasma display device according to claim 1 or claim 2, wherein a blower means is connected to said reinforcement member.

* * * * *